United States Patent
Tsuchiya et al.

(10) Patent No.: US 7,193,247 B2
(45) Date of Patent: Mar. 20, 2007

(54) GALLIUM NITRIDE COMPOUND SEMICONDUCTOR DEVICE

(75) Inventors: Masahiko Tsuchiya, Kanagawa (JP); Naochika Horio, Kanagawa (JP); Kenichi Morikawa, Kanagawa (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 11/276,653

(22) Filed: Mar. 9, 2006

(65) Prior Publication Data

US 2006/0151802 A1    Jul. 13, 2006

Related U.S. Application Data

(62) Division of application No. 10/940,690, filed on Sep. 15, 2004, now Pat. No. 7,049,160.

(30) Foreign Application Priority Data

Sep. 16, 2003 (JP) ............... 2003-322437
Jul. 20, 2004  (JP) ............... 2004-210876

(51) Int. Cl.
*H01L 33/00* (2006.01)

(52) U.S. Cl. ............ 257/99; 257/103; 257/745; 257/E33.063

(58) Field of Classification Search ............ 257/91, 257/99, 103, 745, E33.063, E33.034
See application file for complete search history.

(56) References Cited

U.S. PATENT DOCUMENTS 5,793,405 A    8/1998    Shakuda

2006/0006399 A1 *  1/2006  Nakamura et al. ............ 257/94

FOREIGN PATENT DOCUMENTS

| JP | HEI 5-291621 | 4/1992 |
| JP | HEI 5-211347 | 7/1992 |
| JP | HEI 11-220168 | 2/1998 |
| JP | 2000-183400 | 12/1998 |
| JP | 2000-36619 | 3/1999 |
| JP | 200101134 | 4/2000 |
| JP | 2003-110138 | 9/2001 |
| JP | 2003-110140 | 9/2001 |

* cited by examiner

*Primary Examiner*—Minh-Loan Tran
(74) *Attorney, Agent, or Firm*—Cermak & Kenealy, LLP

(57) ABSTRACT

A GaN compound semiconductor device can be capable of free process design and can have optimum device characteristics. The device can include a group III nitride compound semiconductor laminate structure including an n-type GaN compound semiconductor layer and a p-type GaN compound semiconductor layer. An n electrode can be formed on the n-type GaN compound semiconductor layer, and a p electrode can be formed on the p-type GaN compound semiconductor layer. The n electrode preferably includes an Al layer of 1 to 10 nm, in contact with the n-type GaN compound semiconductor layer, and any metal layer of Rh, Ir, Pt, and Pd formed on the Al layer. The p electrode can be made of a 200 nm or less layer of of Pd, Pt, Rh, Pt/Rh, Pt/Ag, Rh/Ag, Pd/Rh, or Pd/Ag, in contact with the p-type GaN compound semiconductor layer. Both electrodes can make ohmic contact with respective n-type/p-type GaN semiconductors without application of active annealing.

7 Claims, 3 Drawing Sheets

RELATED ART

▲ Al/Ir: 3/100nm
■ Al/Pd: 3/100nm

HEAT TREATMENT ATMOSPHERE: NITROGEN
TIME OF HEAT TREATMENT: 20 SECONDS

▲ Rh: 100nm
■ Pt/Rh: 1nm/100nm

HEAT TREATMENT ATMOSPHERE: NITROGEN
TIME OF HEAT TREATMENT: 20 SECONDS

GALLIUM NITRIDE COMPOUND SEMICONDUCTOR DEVICE

This application is a divisional application, and claims the priority benefit under 35 U.S.C. §120 of U.S. patent application Ser. No. 10/940,690 filed Sep. 15, 2004 now U.S. Pat. No. 7,049,160, which is hereby incorporated in its entirety by reference. This application also claims the priority benefit under 35 U.S.C. §119 of Japanese Patent Application No. 2003-322437, filed on Sep. 16, 2003, and Japanese Patent Application No. 2004-210876, filed on Jul. 20, 2004, which are hereby incorporated in their entirety by reference.

BACKGROUND OF THE INVENTION

1. Filed of the Invention

The present invention relates to a device made of gallium nitride compound semiconductors. In particular, the invention relates to a device having electrodes best suited to gallium nitride compound semiconductors, and a method (device process) of manufacturing the device.

2. Description of the Related Art

FIG. 1 shows a conventional gallium nitride compound semiconductor light-emitting device. This light-emitting device is shown with its electrode side downward since it is mounted on feeding electrodes (not-shown) in a flip chip fashion. This light-emitting device has an n-type gallium nitride compound semiconductor layer 92 (hereinafter, referred to as n-type GaN layer), an active layer 93, and a p-type gallium nitride compound semiconductor layer 94 (hereinafter, referred to as p-type GaN layer) which are formed on a sapphire substrate 91 in this order. The light-emitting device can emit a predetermined wavelength of light when an electric current is supplied to these layers through an electrode 95 for an n-type gallium nitride compound semiconductor (hereinafter, referred to as an n-type GaN electrode) and an electrode 96 for a p-type gallium nitride compound semiconductor (hereinafter, referred to as an p-type GaN electrode). While the substrate illustrated here is a sapphire substrate, it is not limited thereto. It is conventionally known that the substrate may be replaced with an SiC substrate or Si substrate. Thin films of gallium nitride compound semiconductors ($Al_xIn_yGa_{(1-x-y)}N$, $0 \leq x$, $y \leq 1$) can be formed on this substrate by using conventionally-known techniques such as MOCVD (metal organic chemical vapor deposition).

In general, the n-type GaN electrode 95 is made of metal thin films such as Ti/Al and V/Al. The p-type GaN electrode 96 is often made of Pt, or metal thin films such as Ni/Au. As employed in this specification, the expression "A/B layer" shall hereinafter mean that the material A on the left lies closer to a semiconductor layer and the material B on the right lies farther from the semiconductor layer. To improve light output efficiency in the case of flip-chip mounting, there have been known techniques of making the n-type GaN electrode 95 out of an Rh/Al layer having high reflectivity so that the light emitted from the device is reflected at the sapphire-substrate side, and making the p-type GaN electrode 96 out of Rh/Al, Ag, and the like similarly. Incidentally, the reference numerals 97 and 97' in the diagram represent eutectic electrodes.

Examples of these conventional gallium nitride compound semiconductor light-emitting devices and the methods of manufacturing the same include Japanese Unexamined Patent Application Publications Nos. Hei 5-211347, Hei 11-220168, 2003-110140, 2003-110138, Hei 5-291621, 2000-36619, and 2000-183400, which are hereby incorporated in their entirety by reference.

Japanese Unexamined Patent Application Publication No. Hei 5-211347 discloses an electrode having an Ni layer at the junction with an I layer of the gallium nitride compound semiconductor. Japanese Unexamined Patent Application Publication No. Hei 11-220168 discloses a gallium nitride compound semiconductor device of flip chip type in which a thin-film metal layer is interposed between a p-type layer and a thick-film reflective electrode layer. Japanese Unexamined Patent Application Publication No. 2003-110140 discloses a nitride semiconductor light-emitting device in which a predetermined area of an electrode is given high reflectivity for the sake of enhanced light output efficiency. Japanese Unexamined Patent Application Publication No. 2003-110138 discloses a nitride semiconductor light-emitting diode in which the sheet resistance and light transmittance of a transparent p electrode are balanced for improved external quantum efficiency. Japanese Unexamined Patent Application Publication No. Hei 5-291621 discloses the use of Au, Pt, Ag, and Ni as the material for making ohmic contact with a gallium nitride compound semiconductor doped with p-type impurities, and the use of Al, Cr, Ti, and In as the material for making ohmic contact with a gallium nitride compound semiconductor doped with n-type impurities. Japanese Unexamined Patent Application Publication No. 2000-36619 discloses a gallium nitride compound semiconductor device of flip chip type in which Ag, Rh, Ru, Pt, or Pd is used to give a high reflectivity to a thick-film electrode layer to be connected with a p-type layer. Japanese Unexamined Patent Application Publication No. 2000-183400 also discloses a gallium nitride compound semiconductor device of flip chip type in which a thick-film electrode layer to be connected with a p-type layer is given a high reflectivity.

The conventional GaN electrodes mentioned above, however, have included no disclosure on the finding that annealing is not actively performed for the sake of ohmic contact with the semiconductor layer(s). In any of the above cases, establishing ohmic contact with a gallium nitride compound semiconductor requires annealing at or above 400° C. This causes several problems as follows:

(1) A first problem is evident in that surface contamination and oxidation are inevitable in the annealing furnace.

In typical GaN device processes, a wafer is annealed by either: the successive steps i) of forming n-type GaN electrodes->annealing->forming p-type GaN electrodes->annealing (alternatively, the p-type GaN electrodes and the n-type GaN electrodes are formed by steps of inverted order); or the successive steps ii) of forming n-type GaN electrodes->forming p-type GaN electrodes->annealing (alternatively, the p-type GaN electrodes and the n-type GaN electrodes are formed by steps of inverted order).

With the steps i), the n-type GaN electrodes are formed before annealing for establishing ohmic contact. At the time of annealing, the areas of the wafer surface for forming the p-type GaN electrodes are thus exposed directly to the furnace atmosphere. This inevitably contaminates the surface with impurities in the furnace and causes surface oxidation, so that the p-type GaN electrodes formed thereon become poor in electric characteristic. Even if the electrode-forming surface is cleaned to alleviate contamination and surface oxidation, the n-type GaN electrodes that are formed already preclude cleaning processes that can affect the material of the electrodes. This results in imperfect cleaning. In addition, the presence of the annealing even after the formation of the p-type GaN electrodes can give the n-type GaN electrodes an excessive heat history. The two annealing processes thus result in poorer electric characteristics. The same problems can also occur when the p-type GaN electrodes are formed first.

The steps ii) will not cause the same problems as those of steps i) since the annealing is conducted only once unlike in the steps i). It is required, however, that more severe temperature, atmosphere, time, and other annealing conditions for the n-type GaN electrodes or the p-type GaN electrodes be applied as the conditions of the annealing process after the electrode formation. Consequently, the other electrodes which would exhibit optimum ohmic characteristics at milder conditions are inevitably deteriorated in characteristic.

The n-type GaN electrodes and p-type GaN electrodes both can be evaporated and annealed at the same time if they were of the same material and the same conditions. Such a material, however, has not been adequately found so far.

For example, when the n-type GaN electrode 95 requires annealing at around 400° C. and the p-type GaN electrode 96 requires annealing at around 700° C., the p-type GaN electrode 96 must be formed first. The reason is that if the n-type GaN electrode 95 is formed first, it must undergo the 700° C. annealing in order for the p-type GaN electrode 96 formed later on the same wafer to acquire ohmic characteristics. This applies excessive heat to the n-type GaN electrode 95 resulting in deterioration in electric characteristics.

(2) A second problem lies in that the device process is limited.

The eutectic electrodes 97 and 97' shown in FIG. 1 have a metal laminate structure such as a Ti/Au/(Pt/Au)$_n$ layer and an Ni/Au/(Pt/Au)$_n$ layer. The outermost surface layer of the eutectic electrodes 97, 97' is an eutectic material layer of Au, under which an eutectic limitation layer of Pt is formed. For flip chip connection, these layers are put downward and connected with Au/Sn eutectic parts which are laminated on the side of a submount or wiring. At the time of connection, the Au layers at the outermost surface of the eutectic electrodes 97, 97' and the Au layer at the outermost surface of the eutectic parts of the submount are put together, to which a heat of around 300° C. is applied to create an Au/Sn eutectic state for junction. Thus, if the n-type GaN electrode 95 described above is formed and then the film forming step is continued to form the eutectic electrodes 97 and 97' before annealing is conducted at or above 400° C. for the sake of ohmic connection of the electrode metal, the eutectic metal can melt during the annealing to preclude the function of the electrodes 97 and 97'. Hence, both the electrodes 95 and 96 for n-type GaN and p-type GaN must be formed and annealed before the eutectic electrodes 97 and 97', which are formed in a separate step. Incidentally, as employed in this specification, the expression "(A/B)$_n$ layer" shall mean that the material A and the material B are laminated n times repeatedly.

In general, when annealed at excessive temperatures, each of the n-type GaN electrodes and p-type GaN electrodes is coarsened at the surface of its metal layer on the semiconductor-layer side, with an unfavorable deterioration in reflectivity and ohmic characteristic. When Pt, Rh, Pd, and the like are used as a p-type GaN electrode for LED in particular, the heat treatment can increase the startup voltage (Vf) by 0.05 to 0.2 V. Needless annealing is thus better omitted.

As described above, the sequence of the device process depends on order of temperatures of the annealing processes on the wafer. In addition, the annealing temperature cannot be optimized. This inevitably causes the problems that the device process cannot be designed freely, and device characteristics cannot be optimized.

SUMMARY OF THE INVENTION

The present invention has been achieved in view of the problems mentioned above as well as other problems in the art related to GaN electrodes and electrode formation processes. In accordance with a first aspect of the invention, gallium nitride compound semiconductor device can be capable of free process design and can have optimum device characteristics. In accordance with another aspect of the invention, methods of manufacturing the same are disclosed.

In accordance with still another aspect of the invention, a GaN type compound semiconductor device process can include electrodes having predetermined laminate structures that are used as electrodes intended for semiconductors, thereby forming a device which requires little or no active annealing in any of the processes for forming an n-type GaN electrode, forming A p-type GaN electrode, forming eutectic electrodes, and other types of electrodes.

In accordance with yet another aspect of the invention, a method for manufacturing a gallium nitride compound semiconductor light-emitting device having a gallium nitride compound semiconductor and an electrode formed in contact with the gallium nitride compound semiconductor, the electrode making ohmic contact therewith can include: laminating a layer of gallium nitride compound semiconductor on a substrate, exposing the gallium nitride compound semiconductor layer at its surface, if required, applying surface treatment to the exposed surface of the gallium nitride compound semiconductor, and forming an electrode for a gallium nitride compound semiconductor on the surface given surface treatment. The method can include the absence of annealing for establishing the ohmic contact that is typically performed between the completion of forming the electrode and mounting the gallium nitride compound semiconductor light-emitting device onto a mount substrate.

The gallium nitride compound semiconductor is preferably any one of an n-type gallium nitride compound semiconductor and a p-type gallium nitride compound semiconductor.

In the case of the n-type GaN semiconductor, forming the electrode may preferably include evaporating an Al layer having a thickness of 1 to 10 nm onto the n-type gallium nitride compound semiconductor layer, and evaporating a layer of any metal selected from the group consisting of Rh, Ir, Pt, and Pd onto the Al layer. Alternatively, forming said electrode may include evaporating an Al layer having an island-like or mesh-like structure and a thickness of 1 to 10 nm onto the n-type gallium nitride compound semiconductor layer, and evaporating a layer of any metal selected from the group consisting of Rh, Ir, Pt, and Pd simultaneously with or after evaporating the Al layer.

More specifically, a Pt/Rh layer or a Pt/Ag layer is preferably used as the p-type GaN electrode. An Al/Rh layer, an Al/Ir layer, an Al/Pd layer, or an Al/Pt layer is preferably used as the n-type GaN electrode. This makes it possible to form a GaN device without annealing. Different from conventional materials, these materials achieve favorable ohmic characteristics without annealing.

It has been conventionally known that the n-type GaN electrode can be made of Al alone. This electrode is poor in ohmic characteristic, however, and provides ohmic contact only after annealing. In addition, such metals as Rh, Pd, Ir, and Pt cannot establish ohmic contact with n-type gallium nitride compound semiconductors. Through studies, however, the inventors have found that these materials can be combined to provide favorable ohmic characteristics with respect to n-type gallium nitride compound semiconductors without annealing.

FIG. 5 shows the dependence of the contact resistances of an Al/Ir layer electrode and an Al/Pd layer electrode versus annealing temperature. Here, the Al layer was 3 nm in thickness, and the Ir layer or Pd layer 100 nm in thickness. The layers were formed on an n-type GaN layer having a carrier density on the order of $1\times10^{18}$ 1/cm$^3$ by vacuum deposition. The thicknesses were controlled by monitoring the deposition thickness with a quartz oscillator. The n-type GaN electrodes thusly fabricated were annealed for 20 seconds in a nitrogen atmosphere at predetermined temperatures in an electric furnace. The contact resistivities were measured by the four probe method (transmission line model). In addition, it was found that when an Al/Rh layer electrode was formed instead of an Al/Pd layer electrode under the same conditions, the dependency of the contact resistance of the Al/Rh layer versus annealing temperature was approximately the same as that of the Al/Pd electrode layer.

It is seen that ohmic characteristics on the order of $10^{-6}$ cm$^2$ were obtained at room temperatures, even though the n-type GaN layers of the wafers in use were not so high in doping density. The reason why the ohmic characteristics are acquired is difficult to theorize. However, studies by the inventors have provided some understanding for the ohmic characteristics, as set forth in greater detail below.

Rh, Pd, Ir, and Pt are elements of group VIII, periods 5 and 6, and are known to have an fcc (face centered cubic lattice) crystal structure. For lattice constants, Rh has a value of 380.3 pm, Pd 389.0 pm, Ir 383.94 pm, and Pt 392.3 pm. Al also has an fcc structure, and a lattice constant a=404.96 pm which is only 5% or so greater than those of the foregoing four metals. Thus, it seems that when Al is laminated with Rh or the like, their atomic elements penetrate into the lattices of the others to form a sort of intermetallic compound with some kind of atomic interaction.

In addition, the electrode material of the first layer, or Al, and the electrode material of the second layer, or the metal element, have different atomic radii. It is estimated that the use of Al as the material of the first layer contributes improved adhesiveness because Al has an atomic radius smaller than that of the electrode material of the second layer.

It seems that such interactions as described above occur within the range of 10 nm in depth from the surface of the n-type GaN layer, providing a favorable impact on the ohmic characteristics between the semiconductor layer and the electrode metals. This has been confirmed through experimentation.

In particular, Al/Rh layers were evaluated with the Rh layer kept at a constant thickness of 100 nm and the Al thin film varied in thickness. As a result, favorable ohmic characteristics were obtained with Al thin films of below 10 nm. Incidentally, this examination did not involve any annealing.

The Al thin films that were above 20 nm in thickness showed ohmic characteristics almost equivalent to those of a thick film of Al alone (100 nm) which is formed on an n-type GaN layer and given annealing. That is, when the metal layers of Al/Rh, Al/Ir, and the like are used to establish ohmic contact with an n-type GaN layer, the ohmic characteristics deteriorate sharply when the Al thin film, or the layer formed directly on the semiconductor layer, exceeds 10 nm in thickness. In accordance with an embodiment of the present invention, the Al thin film desirably has a thickness in the range of 1 and 10 nm, more desirably 1 and 5 nm for facilitating control of film thickness in film formation, and even more desirably 2 and 4 nm. It is difficult to obtain favorable ohmic characteristics at thicknesses below 1 nm.

While the structure of the Al layer is defined as "thin film," island-like and mesh-like structures can provide the same effects. The "thin film" thus includes these and other structures. Moreover, ohmic contact can also be obtained without annealing when an alloy layer such as Al—Rh is formed as the electrode by using some sort of method such as simultaneous evaporation of Al and Rh, etc. The interaction between such metals as Al and Rh, occurring near the surface of the n-type GaN layer, provides ohmic contact. Various applications using this principle of interaction can fall within the spirit and scope of the invention.

An N electrode made of 3-nm Al/100-nm Rh without annealing and the same electrode annealed at 500° C. were measured for output efficiency. The result shows that the application of annealing lowered the reflectivity by approximately 2-3%. A drop was also observed in surface reflectivity. This seems ascribable chiefly to the Al and Rh growing in the grain boundary, and the interface between Al and the n-type GaN layer causing diffusion.

A p-type GaN electrode for making ohmic contact without annealing can also be obtained by forming a Rh, Pd, Pt, Pt/Rh, Pt/Ag, Rh/Ag, Pd/Rh, or Pd/Ag layer on the surface of a p-type GaN layer. In this case, the Pt layer preferably has a thickness of 0.3 to 100 nm and/or the Rh or Ag layer has a thickness of 50 to 300 nm. Alternatively, the Pd, Pt, or Rh layer may have a thickness of 0.3 to 200 nm.

The annealing temperature dependence of the contact resistances of these electrodes appears in FIG. 6.

FIG. 6 shows the dependence of the contact resistances of a pure Rh layer electrode and a Pt/Rh layer electrode versus annealing temperature. The Rh layer was 100 nm in thickness, and the Pt layer 1 nm in thickness. These layers were formed on a p-type GaN layer by vacuum deposition. The thicknesses were controlled by monitoring the deposition thickness with a quartz oscillator. The p-type GaN electrodes thusly fabricated were annealed for 20 seconds in a nitrogen atmosphere at predetermined temperatures in an electric furnace. The contact resistivities were measured by the four probe method (transmission line model).

It is seen that ohmic characteristics on the order of $10^{-4}$ cm$^2$ are obtained at room temperatures.

These electrode materials have been conventionally considered to make no ohmic contact or have extremely high resistance unless annealed. Through studies, however, the inventors have found that p-type GaN electrodes having practical low resistance can be obtained without annealing.

In accordance with another aspect of the present invention, when the electrode for a p-type gallium nitride compound semiconductor is made of a Pt/Rh electrode or a Pt/Ag layer electrode, the electrode preferably includes i) the Pt layer having a thickness of 0.3 to 100 nm: and/or ii) the Rh or Ag layer having a thickness of 50 to 300 nm. In the case that the electrode for a p-type gallium nitride compound semiconductor is made of any layer selected from the group consisting of Pd, Pt, and Rh, the layer preferably has a thickness of 0.3 to 200 nm. If the thickness is below 0.3 nm, reflectivity may decrease. If the thickness is above 200 nm, stress problems may be emphasized. For the same reason, in the case that the electrode for a p-type gallium nitride compound semiconductor is made of Pt/Rh or Pt/Ag, it is preferable that i) a thickness of the Pt layer is 0.3–100 nm; and/or ii) a thickness of Rh, Ag is in a range of 50–300 nm.

With mounting methods of flip chip type in which the light output surface falls on the sapphire-substrate side, the p-type GaN electrode desirably has a high reflectivity with respect to the emission wavelength. Annealing, however, typically lowers the reflectivity of the electrode metal in general. The reason is that the interface between the semiconductor layer and the electrode metal can be coarsened when undergoing heat. A manufacturing method that involves little or no annealing can thus take full advantage of the high reflectivity of the electrode metal with significant contribution to an increase in light output efficiency.

In addition to the above, another embodiment of the present invention can provide a group III nitride compound semiconductor light-emitting device that includes a group III nitride compound semiconductor laminate structure including an n-type gallium nitride compound semiconductor layer and a p-type gallium nitride compound semiconductor layer, an n electrode formed on the n-type gallium nitride compound semiconductor layer, and a p electrode formed on the p-type gallium nitride compound semiconductor layer. In this light-emitting device, the n electrode can include an Al layer having a thickness of 1 to 10 nm, in contact with the n-type gallium nitride compound semiconductor layer, and a layer of any metal selected from the group consisting of Rh, Ir, Pt, and Pd formed on the Al layer, and makes ohmic contact therewith without application of annealing.

In the above case, the p electrode is preferably made of any layer selected from the group consisting of Pd, Pt, Rh, Pt/Rh, Pt/Ag, Rh/Ag, Pd/Rh, and Pd/Ag layers, in contact with the p-type gallium nitride compound semiconductor layer, has a thickness of 200 nm or less, and makes ohmic contact therewith without application of annealing.

Preferably, a metal laminate structure may further be formed on the electrode for an n-type or p-type gallium nitride compound semiconductor by laminating an eutectic limitation layer and an eutectic material layer.

In this case, preferably the eutectic limitation layer is substantially made of Ag or Pt, and the eutectic material layer is made of a material selected from the group consisting of Au, Sn, and In, or an alloy containing at least one of these.

Further, an embodiment of the invention can also include a group III nitride compound semiconductor light-emitting device, in which sides of the semiconductor layers are inclined with respect to a direction perpendicular to a substrate, and the electrodes are formed to extend over the inclined sides.

One of several benefits of the present invention is that it can eliminate the need for annealing in forming the electrodes of the GaN type device. While annealing may still be done to the GaN type devices, it is not necessary. Thus, if little or no annealing is done, a wafer will not accumulate a needless heat history, and the electrodes being processed can be prevented from deteriorating in ohmic characteristics and reflectivity. After the formation of the electrode for n-type or p-type GaN, the eutectic electrode having an Au/Sn laminate structure or the like can be laminated thereon successively without the in-process article being taken out of the vacuum evaporation system. This allows a significant reduction of the total time necessary for the device manufacturing process. Moreover, since the in-process article is not necessarily taken out of the vacuum evaporation system, it is possible to avoid contamination and surface oxidation of the electrode for p-type or n-type GaN. The number of times of evaporation can also be reduced. Another advantage is that the process design has a higher degree of freedom since heat-sensitive organic materials can also be used.

Annealing, when conducted, produces stress due to a difference between the coefficients of thermal expansion of the GaN layer and the electrode material. Accordingly, it is desirable to have a smaller heat history on the electrode material to make the stress accumulation significantly smaller. This can suppress electrode exfoliation for improved reliability.

In particular, the electrode layer excluding the areas of bonding pads preferably has a total thickness of 200 nm or smaller since there occurs little exfoliation.

It is thus evident that devices and methods made in accordance with the principles of the present invention have great industrial significance in the field of GaN type device manufacturing. Note that while the foregoing description has dealt with GaN layers, the same holds for such gallium nitride compound semiconductors as AlGaInN, AlGaN, InGaN, etc. layers.

Still other features, and attendant advantages of the present invention will become apparent to those skilled in the art from a reading of the following detailed description of embodiments constructed in accordance therewith, taken in conjunction with the accompanying drawings.

BRIEF DESCRIPTION OF THE DRAWINGS

These and other features and advantages of the present invention will become clear from the following description with reference to the accompanying drawings, wherein.

DETAILED DESCRIPTION OF EXEMPLARY EMBODIMENTS

Figure 3:
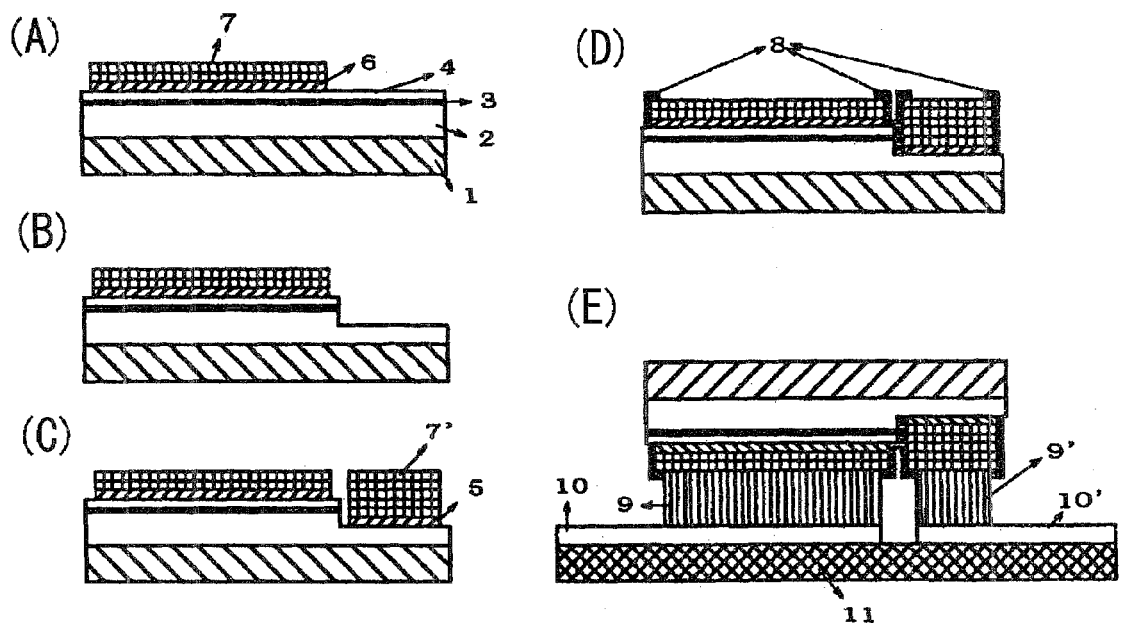
FIGS. 3(A) to 3(E) are diagrams showing an embodiment of a gallium nitride compound semiconductor wafer process in accordance with the principles of the present invention.
Figure 4:
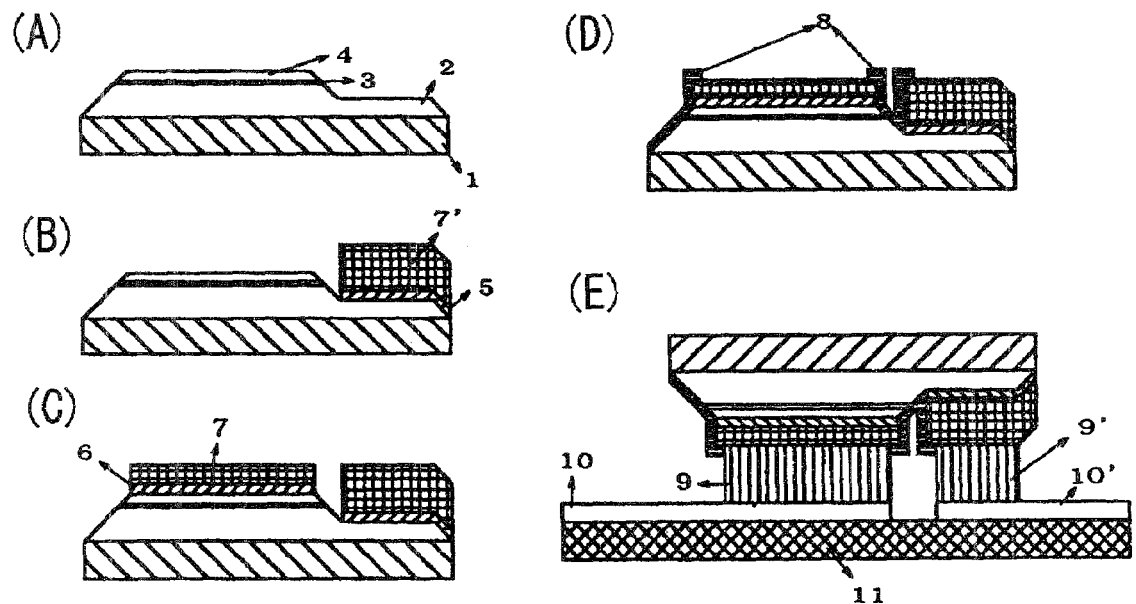
FIGS. 4(A) to 4(E) are diagrams showing another embodiment of a gallium nitride compound semiconductor wafer process made in accordance with the principles of the present invention.
Figure 5:
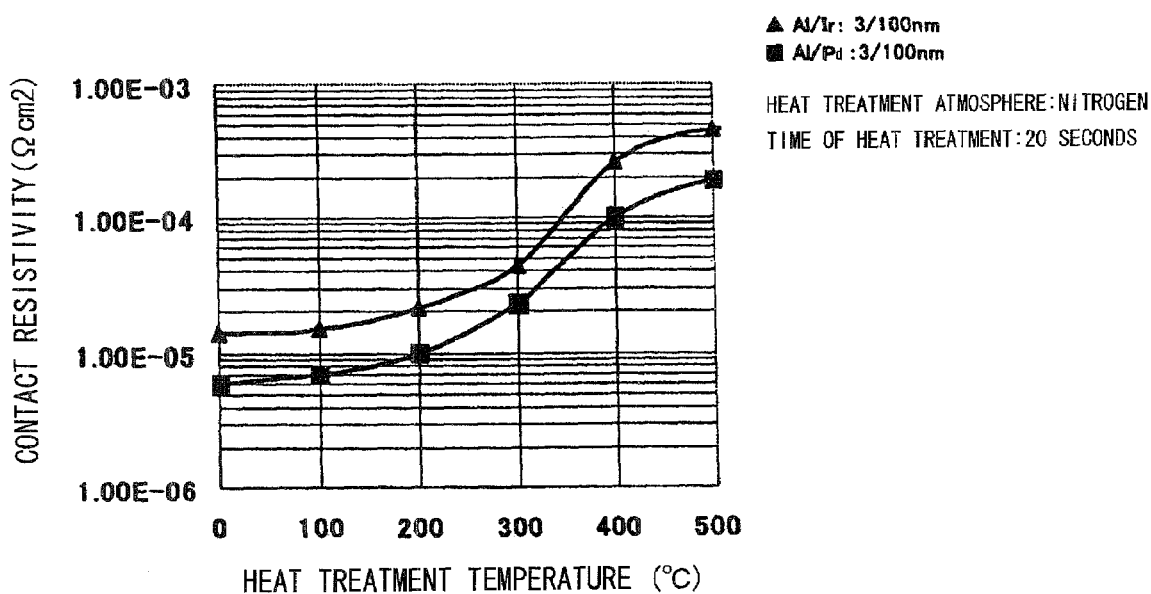
FIG. 5 is a chart showing the annealing temperature versus the contact resistances of electrodes for an n-type gallium nitride compound semiconductor made in accordance with the principles of the present invention.
Figure 6:
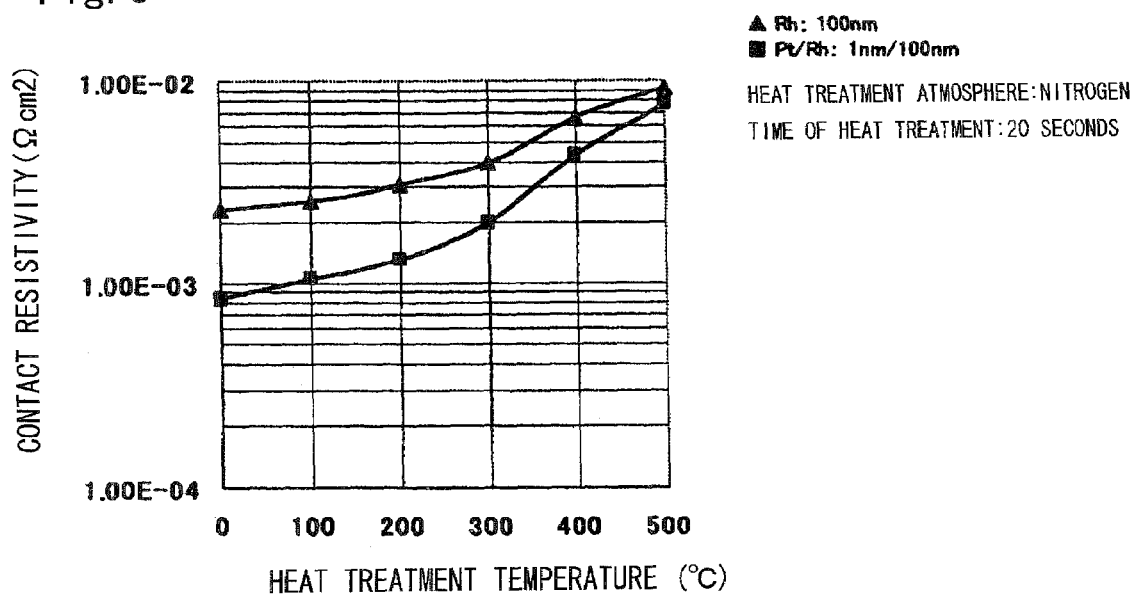
FIG. 6 is a chart showing the annealing temperature versus the contact resistances of electrodes for a p-type gallium nitride compound semiconductor made in accordance with the principles of the present invention.

Hereinafter, detailed description will be given of exemplary embodiments of the present invention. The described embodiments of FIGS. 3 and 4 are predicated on a mounting method of flip chip type. It is understood, however, that the present invention is also applicable in the cases of face-up type in which the light output surface is on the semiconductor side. The described embodiments are just a few examples of experiments which the inventors have made for the sake of confirming the effect of the present invention. The present invention must not be considered as limited to the embodiments described herein.

A device wafer having a silicon (Si) doped n-type GaN layer 2, an active layer 3 made of a gallium nitride aluminum indium compound, and a magnesium (Mg) doped p-type GaN layer 4 via a buffer layer on a sapphire substrate 1 was formed by MOCVD. Then, this wafer was subjected to the following process, which will be described with reference to FIG. 3.

(1) The wafer was subjected to the surface treatment of immersion cleaning in aqua regia (concentrated nitric acid 1: concentrated hydrochloric acid 3 in volume ratio) at 20° C. for five minutes, followed by ultrapure water rinse, whereby the surface of the p-type GaN layer 4 was cleaned. Then, a p-type GaN electrode 6, composed of Pt 1 nm/Rh 100 nm, was formed on the surface by electron beam evaporation. An eutectic electrode 7 of Ti 100 nm/(Pt 100 nm/Au 200 nm)$_2$ was formed successively, and was removed in part (see FIG. 3(A)).

(2) Part of the p-type GaN layer 4 was etched by reactive ion etching, which is a conventionally known technique, so that the n-type GaN layer 2 was exposed in part (see FIG. 3(B)).

(3) An n-type GaN electrode 5, composed of Al 3 nm/Rh 100 nm, was formed on a part of the exposed surface of the n-type GaN layer 2 by photolithography and electron beam evaporation. An eutectic electrode 7' of Ti 100 nm/Pt 100 nm/Au 100-1000 nm/Pt 100 nm/Au 200 nm (the design thickness of the bottom Au layer is variable) was formed successively (see FIG. 3(C)).

(4) The wafer surface excluding the areas of the eutectic electrodes was coated with an SiO$_2$ film 8 by a known technique. The wafer was cut to form a device (see FIG. 3(D)).

(5) The device was joined to a separately-formed submount 11 by thermo compression bonding of 300° C. or so, with the eutectic electrodes 7, 7' of the device and eutectic parts 9, 9' of the submount 11 put together (see FIG. 3(E)).

Incidentally, the reference numerals 10 and 10' in FIGS. 3(E) and 4(E) represent wirings on the submount.

In the conventional art, the device process for forming such electrodes as the n-type GaN electrode, the eutectic electrode on top of the n-type GaN electrode, the p-type GaN electrode, and the eutectic electrode on top of the p-type GaN electrode typically repeat the steps of photolithographic patterning and lamination of electrode material by electron beam evaporation four times. By contrast, the n-type GaN electrode and the eutectic electrode on top of the n-type GaN electrode as shown in FIG. 3 can be formed successively in a single step. The p-type GaN electrode and the eutectic electrode on top of the p-type GaN electrode can also be formed successively in a single step. That is, the electrodes can be formed by a total of two steps, with extremely high cost efficiency. In addition, the maximum heat history on the device is 300° C., which can prevent the device from thermal degradation.

By the following device process shown in FIG. 4, the n-type GaN electrode was formed first on the same wafer as in the embodiment shown in FIG. 3.

(1) Part of the p-type GaN layer 4 was etched by reactive ion etching, which is a conventionally known technique, so that the n-type GaN layer 2 was exposed in part. Here, the sides of the GaN layers 2, 3, and 4 were inclined so as to form an angle of around 45° to the wafer bottom (see FIG. 4(A)).

(2) An n-type GaN electrode 5, composed of Al 3 nm/Ir 100 nm, was formed on the exposed surface and an inclined side of the n-type GaN layer 2 by photolithography and electron beam evaporation. An eutectic electrode 7' of Ni 100 nm/Pt 100 nm/Au 100 nm/(Pt 100 nm/Au 200 nm)$_2$ (the design thickness of the bottom Au layer is variable) was formed successively (see FIG. 4(B)).

(3) An p-type GaN electrode 6, composed of Pt 1 nm/Ag 100 nm, was formed on a part of the surface of the p-type GaN layer 4 by photolithography and electron beam evaporation. An eutectic electrode 7 of Ni 100 nm/Pt 100 nm/Au 100-1000 nm/Pt 100 nm/Au 200 nm was formed successively (see FIG. 4(C)).

(4) The wafer surface excluding the areas of the eutectic electrodes was coated with an SiO$_2$ film 8 by a known technique. The wafer was cut to form a device (see FIG. 4(D)).

(5) The device was joined to a separately-formed submount 11 by thermo compression bonding of 300° C. or so, with the eutectic electrodes 7, 7' of the device and eutectic reaction parts 9, 9' of the submount 11 put together (see FIG. 4(E)).

The GaN layers are inclined at sides, and the electrode(s) for p-type and/or n-type GaN is/are formed to extend over the sides. Since the light that propagates through the layers is reflected at the inclined sides toward the transparent substrate, the light output efficiency is improved as compared to the case where the sides are formed almost perpendicular to the layers. This method is thus effective in terms of light output efficiency, when the device is mounted in a flip chip fashion in particular. In addition, the configuration as described has the following side effects in the electrode forming step.

Incidentally, the reference numerals 10 and 10' in FIGS. 3(E) and 4(E) represent wirings on the submount.

Figure 1:
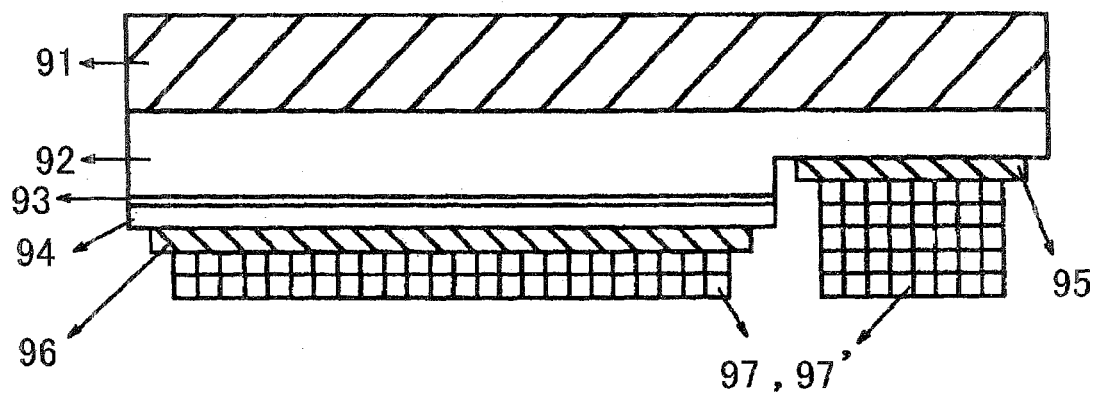
FIG. 1 is a diagram showing a gallium nitride compound semiconductor device according to the conventional art.
Figure 2:
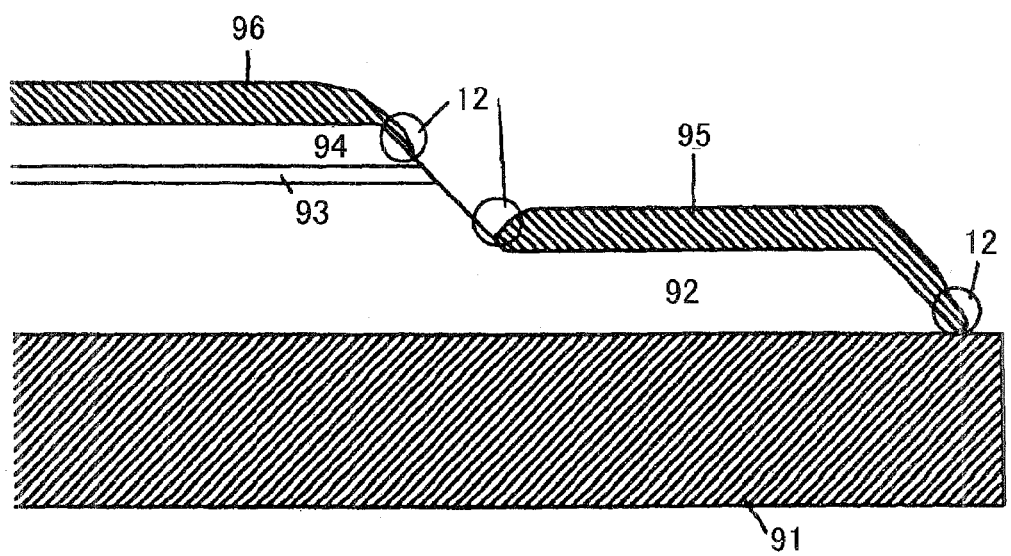
FIG. 2 is a diagram showing electrode deformation caused by annealing according to the conventional art.

When electrodes are formed on inclined sides and annealed as in the conventional method, the electrode metal can sometimes be deformed as indicated by the reference numerals 12 in FIG. 2. The deformation grows with the increasing thickness of the electrode layers, and might possibly cause electrode shorts and other problems. In contrast, the above described device and method include no annealing on the electrodes. This prevents the problem of electrode deformation, and provides a significant effect in improving the reliability at the time of device fabrication.

In the embodiment of FIG. 3, the n-type GaN electrode is made of Al 3 nm/Rh 100 nm, and the p-type GaN electrode is of Pt 1 nm/Rh 100 nm. In the embodiment of FIG. 4, the n-type GaN electrode is made of Al 3 nm/Ir 100 nm, and the p-type GaN electrode is of Pt 1 nm/Ag 100 nm. It is understood, however, that the n-type GaN electrode may be made of Al/Pd and Al/Pt, aside from Al/Rh and Al/Ir. The p-type GaN electrode may also be made of Rh, aside from Pt/Rh and Pt/Ag.

In the embodiments, the eutectic electrodes can be joined by the heat of no higher than 300° C. or so when they are made of Au. This precludes application of heat higher than 300° C. In contrast, the annealing of the electrodes in the conventional art includes a plurality of times in which heating occurs at temperatures of above 400° C., which means a temperature difference of at least 100° C. between the times of heating. Since adverse effects of heat on devices tend to increase exponentially with temperature, the plurality of times that the devices are annealed with a difference of 100° C. will make a substantial difference in the device performance. When the material of the eutectic electrodes is selected optimally, the final heat history on the device can be reduced further. In particular, when the mounting method of flip chip type described above is adopted, the impact of the heat in establishing eutectic connection can be favorably reduced if the eutectic electrodes formed on the gallium nitride electrodes are composed of an eutectic electrode layer and an eutectic limitation layer, and the eutectic electrode layer is made of a metal selected from the group consisting of Au, Sn, and In, or an alloy containing at least one of these, or Au or an Au-containing alloy particularly. Moreover, when the eutectic limitation layer is made of Ag or Pt, the material of the eutectic electrode layer can be effectively prevented from diffusing into the gallium nitride layers or the electrodes for those layers if the electrodes are those that do not require active annealing and the eutectic electrode layer contains Au, Sn, or In. The eutectic electrode layer and the eutectic limitation layer can be laminated a plurality of times for higher effect. The layers preferably have a thickness of 50 to 2000 nm each. Between the n-type GaN or p-type GaN electrode and the eutectic electrode, a Ti layer or Ni layer may be interposed to suppress diffusion further.

When a face-up type mounting method is employed with no eutectic electrode, the device process can be completed and mounted substantially without any thermal treatment.

While there has been described what are at present considered to be exemplary embodiments of the present invention, it will be understood that various modifications may be made thereto, and it is intended that the appended claims cover all such modifications as fall within the true spirit and scope of the invention.

Having described embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A group III nitride compound semiconductor light-emitting device comprising:
    a group III nitride compound semiconductor laminate structure including an n-type gallium nitride compound semiconductor layer and a p-type gallium nitride compound semiconductor layer;
    an n electrode formed on the n-type gallium nitride compound semiconductor layer; and
    a p electrode formed on the p-type gallium nitride compound semiconductor layer, and wherein
    the n electrode includes an Al layer having a thickness of 1 to 10 nm, in contact with the n-type gallium nitride compound semiconductor layer, and a layer of any metal selected from the group consisting of Rh, Ir, Pt, and Pd formed on the Al layer, the n electrode is in ohmic contact with the n-type gallium nitride compound semiconductor layer and is not annealed.

2. The group III nitride compound semiconductor light-emitting device according to claim 1, wherein the p electrode is made of any layer selected from the group consisting of Pd, Pt, Rh, Pt/Rh, Pt/Ag, Rh/Ag, Pd/Rh, and Pd/Ag layers, in contact with the p-type gallium nitride compound semiconductor layer, and has a thickness of 200 nm or less, the p electrode is in ohmic contact with the p-type gallium nitride compound semiconductor layer and is not annealed.

3. The group III nitride compound semiconductor light-emitting device according to claim 2, wherein a metal laminate structure is formed on one of the p electrode and the n electrode by laminating an eutectic limitation layer and an eutectic material layer.

4. The group III nitride compound semiconductor light-emitting device according to claim 3, wherein:
    the eutectic limitation layer is substantially made of one of Ag and Pt; and
    the eutectic material layer is made of a material selected from the group consisting of Au, Sn, In, and alloys thereof.

5. The group III nitride compound semiconductor light-emitting device according to claim 1, wherein a metal laminate structure is formed on one of the p electrode and the n electrode by laminating an eutectic limitation layer and an eutectic material layer.

6. The group III nitride compound semiconductor light-emitting device according to claim 5, wherein:
    the eutectic limitation layer is substantially made of one of Ag and Pt; and
    the eutectic material layer is made of a material selected from the group consisting of Au, Sn, In, and alloys thereof.

7. The group-III nitride compound semiconductor light-emitting device according to claim 1, wherein:
    sides of the semiconductor layers are inclined with respect to a direction perpendicular to a substrate mount surface; and
    the electrodes are formed to extend over the inclined sides.

* * * * *